United States Patent
Watanabe et al.

(10) Patent No.: US 12,474,641 B2
(45) Date of Patent: Nov. 18, 2025

(54) EXPOSURE METHOD, EXPOSURE APPARATUS, AND METHOD FOR MANUFACTURING ARTICLE

(71) Applicant: CANON KABUSHIKI KAISHA, Tokyo (JP)

(72) Inventors: Jinnai Watanabe, Tochigi (JP); Jun Moizumi, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 137 days.

(21) Appl. No.: 18/496,629

(22) Filed: Oct. 27, 2023

(65) Prior Publication Data

US 2024/0142880 A1 May 2, 2024

(30) Foreign Application Priority Data

Oct. 31, 2022 (JP) .................................. 2022-174674

(51) Int. Cl.
*G03F 7/20* (2006.01)
*G03F 7/00* (2006.01)

(52) U.S. Cl.
CPC ................................ *G03F 7/70266* (2013.01)

(58) Field of Classification Search
CPC .. G03F 7/70266; G03F 7/70258; G03F 7/705; G03F 7/706; G03F 7/70491; G03F 7/70525
See application file for complete search history.

(56) References Cited

U.S. PATENT DOCUMENTS

| | | | |
|---|---|---|---|
| 5,801,815 A | 9/1998 | Takahashi | |
| 7,102,731 B2 | 9/2006 | Hirukawa | |
| 9,482,967 B2 | 11/2016 | Van De Kerkhof | |
| 10,394,134 B2 | 8/2019 | Koizumi | |
| 10,545,413 B2 | 1/2020 | Takeshita | |
| 2006/0008716 A1* | 1/2006 | Jeunink | G03F 7/706 430/30 |
| 2008/0246933 A1* | 10/2008 | Uchikawa | G03F 7/70883 355/71 |

FOREIGN PATENT DOCUMENTS

| | | |
|---|---|---|
| JP | 2014103343 A | 6/2014 |
| KR | 20050121728 A | 12/2005 |
| KR | 20060049927 A | 5/2006 |
| KR | 20060128898 A | 12/2006 |
| KR | 20190015136 A | 2/2019 |
| KR | 20220087364 A | 6/2022 |

\* cited by examiner

*Primary Examiner* — Mesfin T Asfaw (74) *Attorney, Agent, or Firm* — Canon U.S.A., Inc. IP Division (57) ABSTRACT

An exposure method includes predicting a change in an optical characteristic of a projection optical system in exposing in which exposure processing is performed on a plurality of substrates via the projection optical system, adjusting the optical characteristic based on a prediction result of the predicting before the exposing, and performing the exposing after the adjusting, wherein, in the adjusting, the optical characteristic at a start of the exposing is adjusted in a direction different from a direction in which the optical characteristic changes, based on a change in the optical characteristic predicted in the predicting.

19 Claims, 9 Drawing Sheets

EXPOSURE METHOD, EXPOSURE APPARATUS, AND METHOD FOR MANUFACTURING ARTICLE

BACKGROUND

Field

The present disclosure generally relates to exposure and, more particularly, to an exposure method, an exposure apparatus, and a method for manufacturing an article.

Description of the Related Art

A manufacturing process of semiconductor devices or liquid crystal display devices uses an exposure apparatus that illuminates a master by an illumination optical system and projects a pattern of the master onto a substrate via a projection optical system to expose the substrate. If the projection optical system absorbs exposure light and generates heat, aberration occurs. The aberration affects a result of exposure processing.

Japanese Patent Application Laid-Open No. 2014-103343 discusses a method for predicting aberration due to exposure processing and determining whether to perform the next exposure processing based on a result of prediction.

In view of productivity, in a case where aberration occurs, it is desirable to correct the aberration to perform the next exposure processing promptly. Moreover, aberration can change even while the exposure processing is being performed on one lot. If aberration increases in the middle of the lot, resolution performance can drop and fail to satisfy desired quality.

SUMMARY

The present disclosure is generally directed to providing an exposure method capable of performing exposure processing with a reduced effect of aberration, as well as an exposure apparatus and a method for manufacturing an article.

According to some embodiments, an exposure method includes predicting a change in an optical characteristic of a projection optical system in exposing in which exposure processing is performed on a plurality of substrates via the projection optical system, adjusting the optical characteristic based on a prediction result of the predicting before the exposing, and performing the exposing after the adjusting, wherein, in the adjusting, the optical characteristic at a start of the exposing is adjusted in a direction different from a direction in which the optical characteristic changes, based on a change in the optical characteristic predicted in the predicting.

Further features of the present disclosure will become apparent from the following description of exemplary embodiments with reference to the attached drawings.

DESCRIPTION OF THE EMBODIMENTS

Exemplary embodiments of the present disclosure will be described below with reference to the drawings. The following exemplary embodiments are not intended to limit the disclosure set forth in the claims. While the exemplary embodiments describe a plurality of features, not all the features are necessarily essential to the disclosure, and the features may be combined in any given manner. In the drawings, the same or similar components are denoted by the same reference numerals. A redundant description thereof will be omitted.

In this specification and the drawings, directions are basically expressed using an XYZ coordinate system with mutually orthogonal axes, where the vertical direction is a Z-axis and a horizontal plane perpendicular to the vertical direction is an XY plane. If an XYZ coordinate system is illustrated in a diagram, that coordinate system is given priority.

A specific configuration of each of the exemplary embodiments will be described below.

Figure 1:
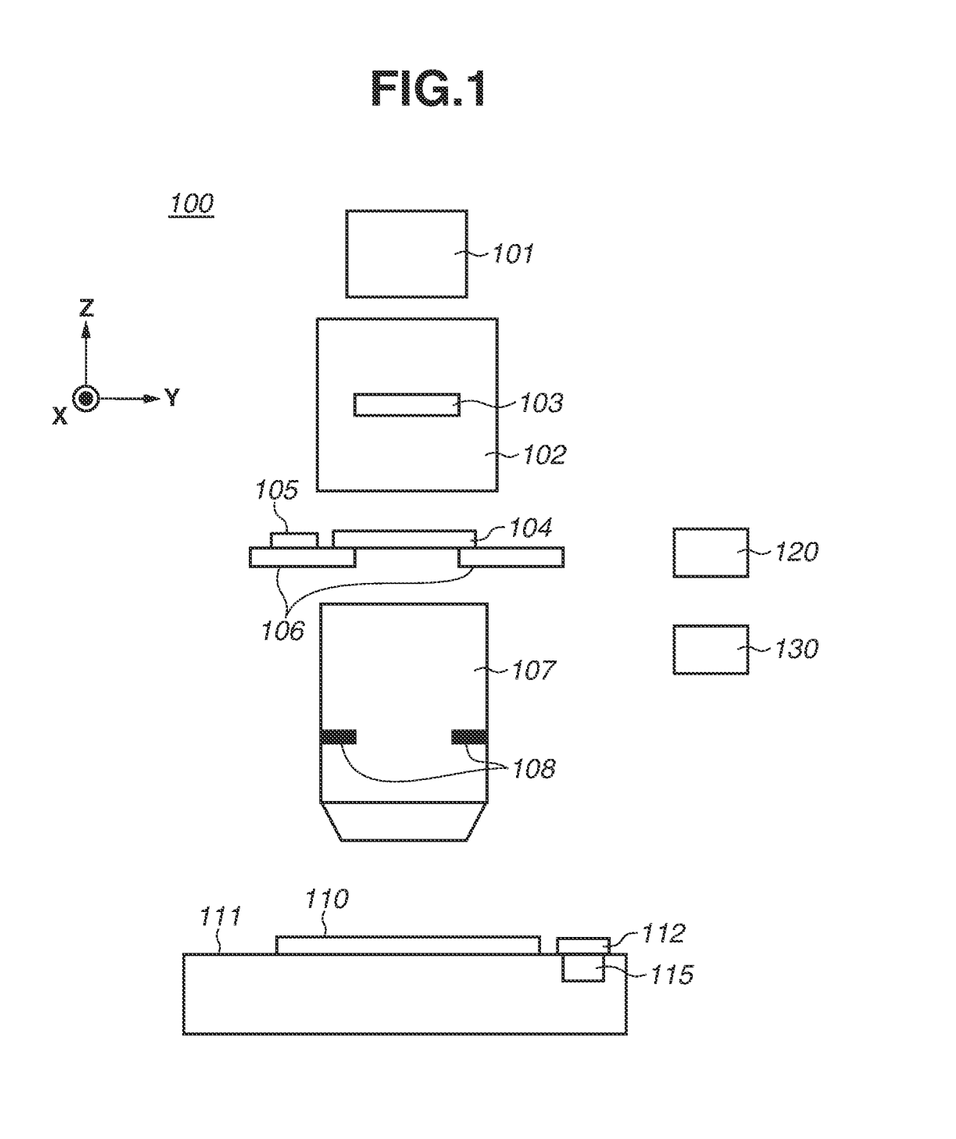
FIG. 1 is a schematic diagram illustrating a configuration of an exposure apparatus according to a first exemplary embodiment.

FIG. 1 is a schematic diagram illustrating a configuration of an exposure apparatus 100 according to a first exemplary embodiment. Light emitted from a light source 101 is incident on an illumination optical system 102. A diffraction optical element 103 forms a light intensity distribution (hereinafter, also referred to as an effective light source distribution) on a pupil plane of the illumination optical system 102, and a reticle 104 is irradiated with the resulting light. The reticle 104 is a master formed of, e.g., quartz glass having a surface on which a pattern to be transferred (for example, circuit pattern) is formed with chromium. The light incident on the pattern drawn on the reticle 104 is diffracted by the reticle 104 and enters a projection optical system 107. The light is adjusted in amount by an aperture stop 108 disposed in the projection optical system 107 and reaches a substrate 110, whereby the pattern on the reticle 104 is projected in a reduced size. Here, the substrate 110 is formed of, e.g., a monocrystalline silicon having a surface on which a photosensitive material (resist) is applied. A control unit 120 has a processor, circuitry, or combinations thereof and can be configured as a controller to control one or more units or components in the exposure apparatus 100. A storage unit 130 stores information obtained from the control unit 120.

The reticle 104 is held on a reticle stage 106. The reticle stage 106 is driven to scan in a +Y direction. A substrate stage 111 holding the substrate 110 is driven to scan in a −Y direction. After an exposure of a shot area ends, the stages are step-driven to expose the next shot area.

A reticle reference plate 105 different from the reticle 104 is disposed on the reticle stage 106. The reticle reference plate 105 is provided with a reticle-side mark for measuring an aerial image. The reticle-side mark is a pattern of cyclically arranged lines and spaces. A detection plate 112 is further disposed on the substrate stage 111. The detection plate 112 is provided with a substrate-side mark (not illustrated) for measuring an aerial image. The substrate-side mark is a pattern of lines and spaces arranged in the same cycle as that of the reticle-side mark. A photodetector 115 is located under the detection plate 112.

Light-blocking portions of the line-and-space patterns on the reticle-side and substrate-side marks are formed of chromium, for example. Light-transmitting portions thereof are formed of glass. The reticle stage 106 is driven in the Y direction so that the reticle-side mark on the reticle reference plate 105 is irradiated with the light emitted from the light source 101 via the illumination optical system 102. The light having passed through the reticle-side mark on the reticle reference plate 105 reaches the substrate-side mark on the detection plate 112 via the projection optical system 107. The reached light passes through the substrate-side mark on the detection plate 112 and reaches the photodetector 115.

Next, aerial image measurement that is a measurement method for measuring astigmatism (optical characteristic) will be described.

The reticle reference plate 105 is irradiated with the light emitted from the light source 101 via the illumination optical system 102, whereby the reticle-side mark is projected in a reduced size onto the substrate-side mark via the projection optical system 107. If the substrate stage 111 is moved in a Z direction that is an optical axis direction in a state of reduced size projection, an image of the reticle-side mark projected in a reduced size matches the reference-side mark at a best focus position of the projection optical system 107. Here, the amount of light received by the photodetector 115 is maximized. As the substrate stage 111 moves away from the best focus position, the image of the reticle-side mark projected in a reduced size onto the substrate-side mark on the detection plate 112 decreases in contrast and blurs, and the amount of light received by the photodetector 115 drops.

Figure 2:
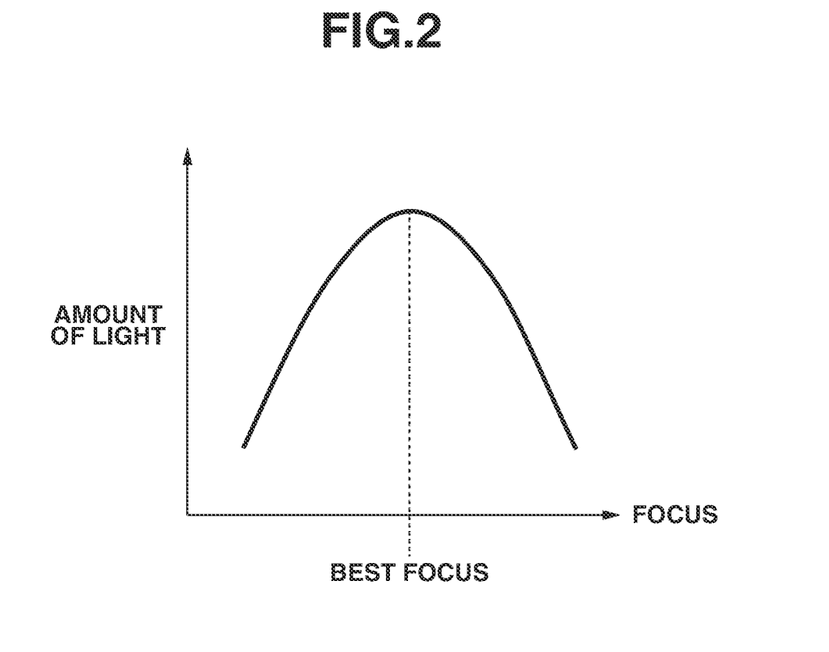
FIG. 2 is a chart illustrating a relationship between focus and the amount of light in driving a substrate stage in a Z direction.

FIG. 2 is a diagram illustrating a relationship between the focus and the amount of light when the substrate stage 111 is driven in the Z direction. FIG. 2 illustrates an example of a case where the substrate stage 111 is driven in the Z direction across the best focus position, with the reticle-side mark being projected in a reduced size onto the substrate-side mark. The horizontal axis indicates the focus, and the vertical axis indicates the amount of light detected by the photodetector 115. The illustrated relationship between the focus and the amount of light has a curved shape convex upward. The peak position of the curved shape is the best focus position. While, in the present exemplary embodiment, an example has been described where the best focus position is determined from a result of detection of the light having passed through the reticle-side mark and the substrate-side mark by the photodetector 115, the method for determining the best focus position is not limited to this example.

Figure 3:
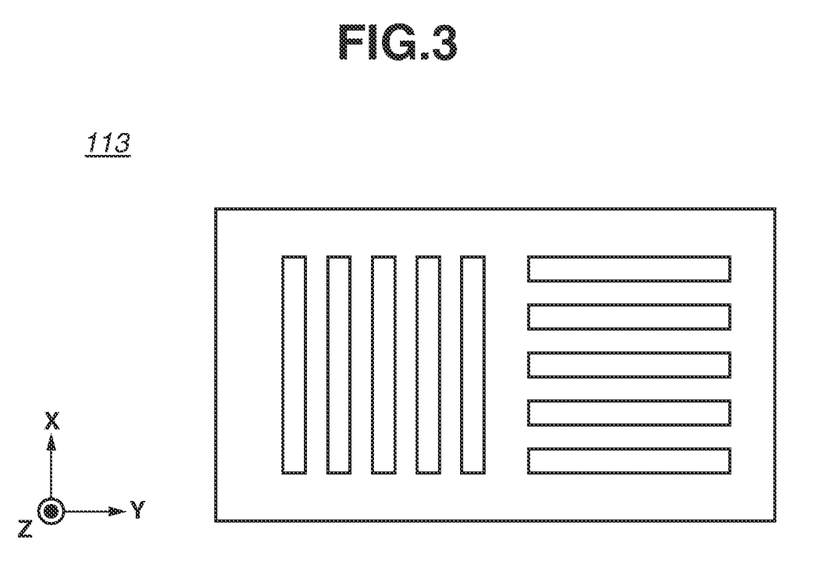
FIG. 3 is a schematic diagram illustrating a line-and-space pattern of a reticle-side mark.

FIG. 3 is a schematic diagram illustrating the line-and-space pattern of a reticle-side mark 113. The substrate-side mark has a similar configuration. The reticle-side mark 113 and the substrate-side mark each include X- and Y-direction line-and-space patterns for astigmatism measurement. With the X- and Y-direction line-and-space patterns of the reticle-side mark 113 being projected in a reduced size onto the substrate-side mark, the substrate stage 111 is driven in the Z direction over an area across (including) the best focus positions both in the X and Y directions. As a result, the relationship between the focus and the amount of light illustrated in FIG. 2 can be obtained of both the X- and Y-direction line-and-space patterns. Based on the obtained relationships between the focus and the amount of light of the X- and Y-direction line-and-space patterns, the best focus positions in the X and Y directions are determined from the respective positions where the amount of light is maximized (peak positions). Astigmatism can be determined by determining a difference between the best focus position in the X direction and the best focus position in the Y direction.

Figure 4:
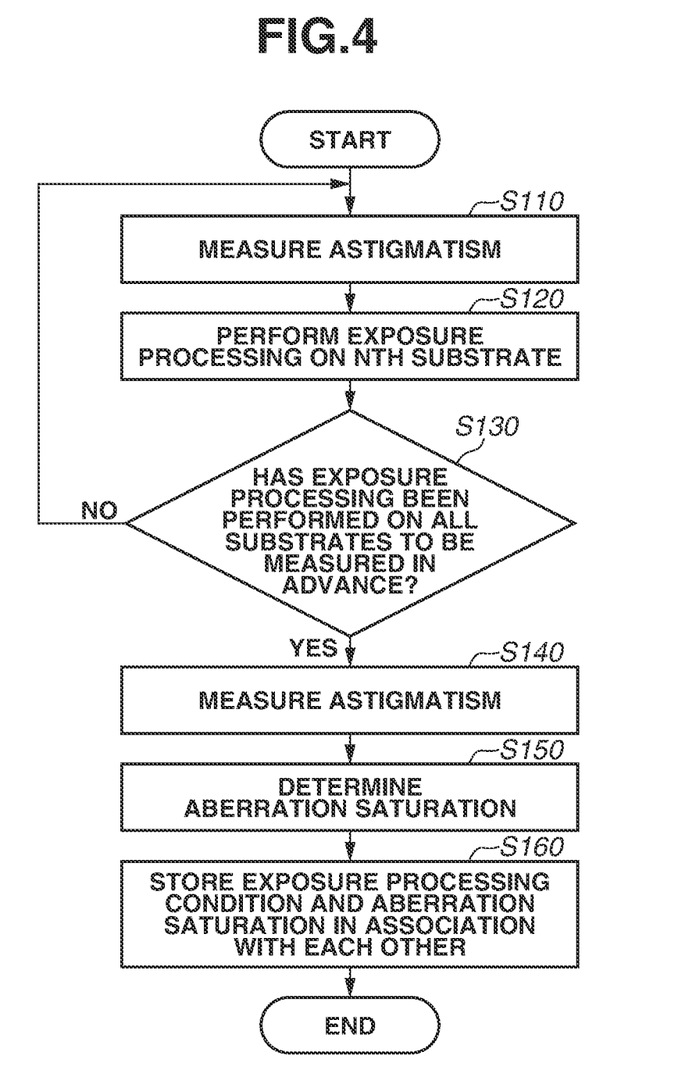
FIG. 4 is a flowchart for storing an aberration saturation to be used in prediction equations for predicting astigmatism according to the first exemplary embodiment.

FIG. 4 is a flowchart for storing an aberration saturation P (first coefficient) used in prediction equations (models) for predicting astigmatism according to the present exemplary embodiment. In the present exemplary embodiment, first information, or information including the aberration saturation P (first coefficient) for predicting a change in an optical characteristic during an exposure process where the exposure processing is performed, is obtained in advance.

In step S110, astigmatism is measured from the effective light source distribution for the exposure processing. In step S120, the exposure processing is performed on an Nth substrate on which the exposure processing has not been performed among substrates to be measured in advance. The substrates to be measured in advance refer to substrates to be used to determine the aberration saturation P. For example, the substrates to be measured in advance are substrates included in one lot. The aberration saturation P is a value specific to an exposure processing condition. In step S130, the control unit 120 determines whether the exposure processing has been performed on all the substrates to be measured in advance. If the exposure processing has not been performed on all the substrates to be measured in advance (NO in step S130), the processing returns to step S110. If the exposure processing has been performed on all the substrates to be measured in advance (YES in step S130), the processing proceeds to step S140. In step S140, the astigmatism is measured from the effective light source distribution for the exposure processing. In step S150, the control unit 120 determines the aberration saturation P to be used in the prediction equations. In step S160, the storage unit 130 stores the exposure processing condition and the aberration saturation P in association with each other, and the processing ends. In the present exemplary embodiment, an example has been described where all the substrates to be measured in advance (for example, 25 substrates included in a lot) are to be measured for the optical characteristic (astigmatism). However, if the amount of information obtained is sufficient, not all the substrates to be measured in advance need to be measured for the optical characteristic (astigmatism). For example, if, in step S130, the exposure processing is determined to have been performed on all the substrates to be measured in advance, the processing may skip step S140 and proceed to step S150.

The aberration saturation P to be used in the prediction equations for predicting astigmatism, which is determined in step S150, is obtained by fitting measurements of the astigmatism to prediction equations expressed by Eqs. (1), (2), and (3). An amount of astigmatism that occurs in actual exposure processing can be predicted based on the determined aberration saturation P, the prediction equations Eqs. (1), (2), and (3), and a measurement result (second information) of aberration before the exposure processing.

$$\Phi_N = \Phi_{1N} + \Phi_{2N} + \Phi_{3N}, \qquad \text{Eq. (1)}$$

$$\Phi_{mN} = P_n \times \alpha_N - (P_m \times \alpha_N - \Phi_{mN-1}) \times \exp\left(-\frac{T_N}{K_m}\right), \text{ and} \qquad \text{Eq. (2)}$$

$$\alpha_N = \frac{R \times D \times A \times Num_N}{T_N}. \qquad \text{Eq. (3)}$$

Here, Φ indicates a predicted amount of occurrence of modeled astigmatism, and the suffix N indicates the timing of measurement of the astigmatism. In the present exemplary embodiment, three time constants (K) are used. The suffix m indicates a model number, where m=1 refers to a long-term time constant model, m=2 refers to a medium-term time constant model, and m=3 refers to a short-term time constant model. While, in the present exemplary embodiment, three aberration saturations P are determined using the three time constant models, the number of time constant models may be two or more. α indicates an exposure load, which changes in value depending on an exposure condition. As expressed by Eq. (3), the exposure load α can be determined from a reticle transmittance R, an amount of exposure D, a shot size A, the number of shots Num between one astigmatism measurement and another astigmatism measurement, and time T between one astigmatism measurement and another astigmatism measurement. The exposure load α may be calculated using other parameters, such as a resist reflectance.

Figure 5:
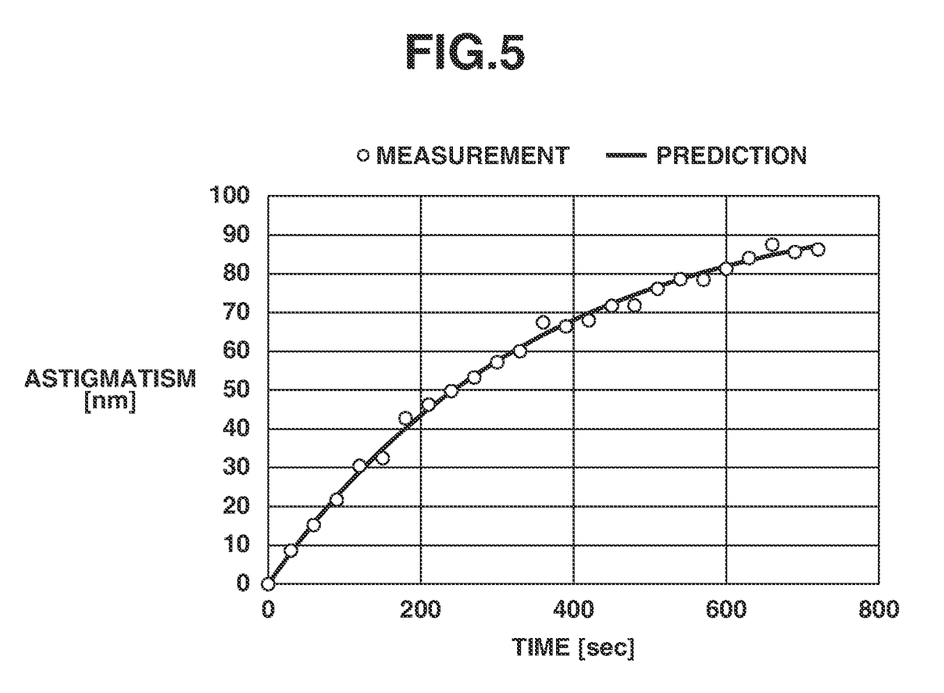
FIG. 5 illustrates a result of aberration prediction according to the first exemplary embodiment.

FIG. 5 illustrates results of aberration prediction according to the present exemplary embodiment. The horizontal axis indicates time, and the vertical axis indicates the amount of astigmatism. The white dots represent the measurements of the astigmatism obtained in steps S110 and S140, and the solid line represents the aberration predicted to occur using the prediction equations. The control unit 120 measures the astigmatism in steps S110 and S140 under a feasible exposure processing condition in advance, and determines the aberration saturation P from the measurements and Eqs. (1), (2), and (3). Then, the storage unit 130 stores the aberration saturation P determined by the control unit 120 and the exposure processing condition in association with each other. When the control unit 120 performs exposure processing under the same exposure processing condition as that stored in the storage unit 130, the control unit 120 predicts the amount of aberration that occurs during the exposure processing based on the information stored in the storage unit 130. Specifically, the control unit 120 predicts the amount of aberration that occurs based on the aberration saturation P stored in the storage unit 130 in association with the exposure processing condition, Eqs. (1), (2), and (3), and a result of the astigmatism measurement measured before the exposure processing.

Figure 6A:
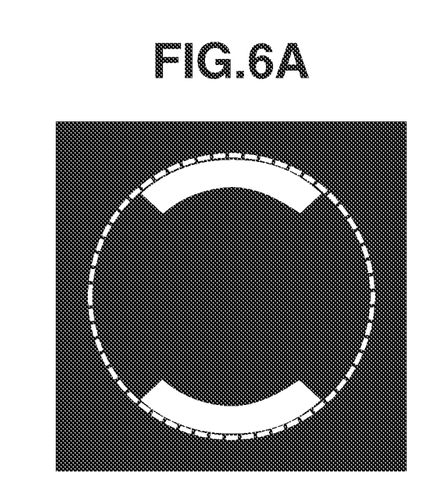
FIGS. 6A and 6B illustrate examples of a light intensity distribution on a pupil plane of an illumination optical system used for dummy irradiation according to the first exemplary embodiment.
Figure 6B:
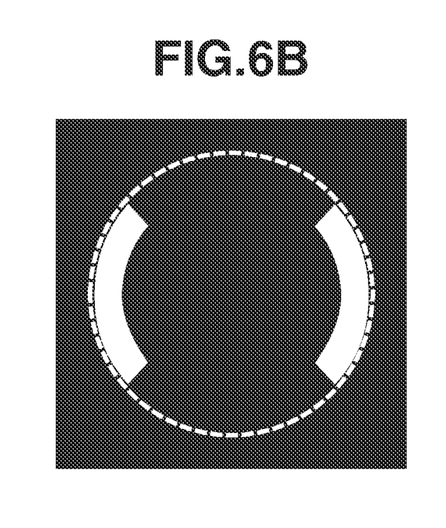

Next, dummy irradiation for correcting astigmatism will be described. FIGS. 6A and 6B illustrate examples of a light intensity distribution (effective light source distribution) on the pupil plane of the illumination optical system 102 for use in the dummy irradiation according to the present exemplary embodiment. The light emitted from the light source 101 is shaped into an effective light source distribution illustrated in FIG. 6A or 6B by the diffraction optical element 103 in the illumination optical system 102. The dotted lines in FIGS. 6A and 6B represent σ=1. The white areas have light intensity.

The light of the effective light source distribution that has been shaped is made to enter the projection optical system 107 via the illumination optical system 102 without passing through the reticle 104. Here, the aperture stop 108 located near the pupil of the projection optical system 107 is shut so that the light entering the projection optical system 107 illuminates the aperture stop 108 and does not reach the substrate 110. The incidence of the light having entered the projection optical system 107 on a group of lenses constituting the projection optical system 107 heats the lenses due to absorption by a glass material of the lenses and absorption by antireflection films, and the refractive indices of the lenses change to cause wavefront aberration. For example, if the effective light source distribution illustrated in FIG. 6A is formed by the diffraction optical element 103 and made to enter the projection optical system 107, the projection optical system 107 causes wavefront aberration with a distribution corresponding to the effective light source distribution. In other words, the sign of the astigmatism can be controlled by switching the diffraction optical element 103 to select the effective light source distribution so that the astigmatism has a desired sign, and performing dummy irradiation. Moreover, a desired amount of astigmatism can be obtained by adjusting the duration of the dummy irradiation. While, in the present exemplary embodiment, an example is described where the dummy irradiation is performed using 20 components of wavefront aberration, 30 or 40 components may be used without any particular limitation.

A method for determining the duration of the dummy irradiation will now be described. First, information about the relationship between the duration of the dummy irradiation on the projection optical system 107 and the amount of change in the astigmatism of the projection optical system 107 is obtained in advance. Next, a coefficient of proportionality (Coef) indicating the amount of change in the astigmatism of the projection optical system 107 per unit time is determined based on the obtained information. The coefficient of proportionality (Coef) is a second coefficient. The duration of the dummy irradiation (irradiation time) is then determined based on Eq. (4):

$$T = \text{Coef} \times AS, \qquad \text{Eq. (4)}$$

where T is the duration of the dummy irradiation, and AS is the amount of astigmatism to be changed in adjusting the astigmatism of the projection optical system 107 to a desired value (desired value of the astigmatism).

While, in the present exemplary embodiment, the amount of astigmatism to be changed is adjusted by adjusting the duration of the dummy irradiation, an amount of dummy irradiation may be used instead of the duration of the dummy irradiation.

Figure 7:
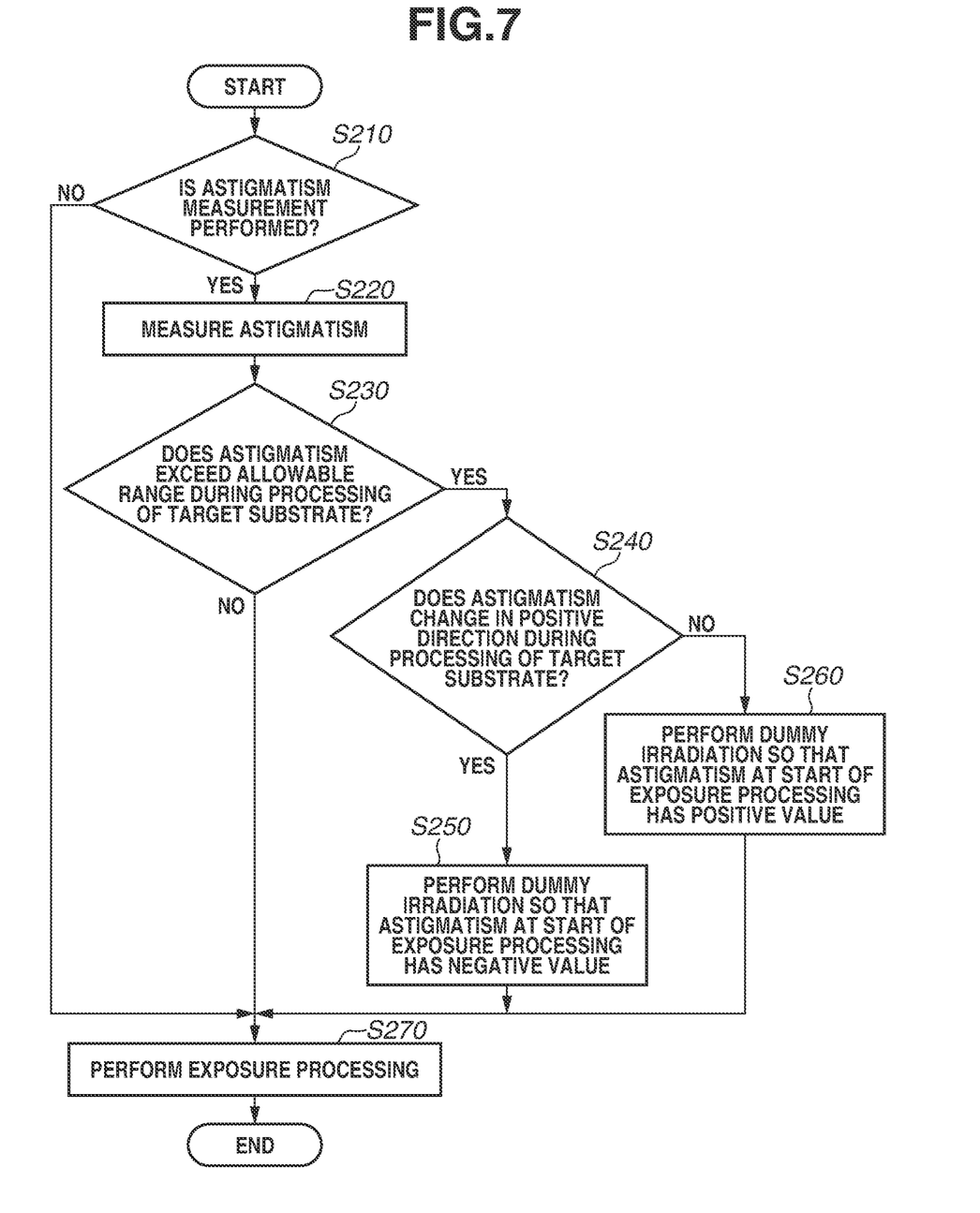
FIG. 7 is a flowchart in performing dummy irradiation to correct astigmatism according to the first exemplary embodiment.

FIG. 7 is a flowchart of performing the dummy irradiation to correct astigmatism according to the present exemplary embodiment. First, in step S210, the control unit 120 determines whether to perform the astigmatism measurement. Here, a timing to perform the astigmatism measurement can be freely set by the user. The astigmatism measurement can be set to be performed at the beginning of the lot, or before a specific reticle is exposed. If the astigmatism measurement is not performed (NO in step S210), the processing proceeds to step S270. In step S270, the exposure processing is performed, and the processing ends. If the astigmatism measurement is performed (YES in step S210), in step S220, astigmatism is measured from the effective light source distribution for the exposure processing. Then, in step S230, based on a result of the measurement of the astigmatism and the aberration saturation P stored in association with the exposure processing condition stored in the storage unit 130, the control unit 120 determines whether the astigmatism exceeds an allowable range (predetermined range) during processing of a target substrate (prediction process).

In step S230, the astigmatism is predicted using Eqs. (1), (2), and (3). The storage unit 130 stores a plurality of exposure processing conditions each in association with the first information including the aberration saturation P (first coefficient). The control unit 120 selects the same exposure processing condition as that when the astigmatism is measured from those stored in the storage unit 130, and predicts a change in the astigmatism using the aberration saturation P associated with the selected exposure processing condition.

The target substrate refers to a substrate to be processed by the next astigmatism measurement and, for example, refers to all the substrates in a lot in a case where the user sets the astigmatism measurement to be performed at the beginning of a lot. The allowable range (predetermined range) is set by the user for each exposure processing condition in advance based on an effect of aberration and desired precision of the exposure processing.

If the astigmatism does not exceed the allowable range during the processing of the target substrate (NO in step S230), the adjustment process is not performed, and the processing proceeds to step S270. In step S270, the control unit 120 performs the exposure processing (exposure process), and the processing ends. If the astigmatism exceeds the allowable range during the processing of the target substrate (YES in step S230), the processing proceeds to step S240. In step S240, the control unit 120 determines whether the astigmatism changes in a positive direction during the processing of the target substrate based on the prediction equations expressed by Eqs. (1), (2), and (3). If the astigmatism changes in the positive direction (YES in step S240), in step S250, the control unit 120 retracts the reticle 104 and performs the dummy irradiation, so that the astigmatism at the start of the exposure processing has a value on the negative side within the allowable range (adjustment process). If the astigmatism changes in the negative direction (NO in step S240), in step S260, the control unit 120 retracts the reticle 104 and performs the dummy irradiation, so that the astigmatism at the start of the exposure processing has a value on the positive side within the allowable range (adjustment process). The effective light source distribution used for the dummy irradiation in steps S250 and S260 is switched so that the astigmatism has a desired sign by the dummy irradiation. The amount of change in the astigmatism (optical characteristic) to be changed by the dummy irradiation in steps S250 and S260 is determined so that the astigmatism does not exceed the allowable range during the processing of the target substrate (for example, one lot). Then, based on the determined amount of change in the optical characteristic, the optical characteristic at the start of the exposure process is adjusted. In other words, the astigmatism is adjusted so that the astigmatism is within the allowable range (predetermined range) without an astigmatism adjustment in the exposure process of the target substrate. Specifically, based on the predicted change in the optical characteristic, the optical characteristic at the start of the exposure processing is adjusted in the direction different from a direction in which the optical characteristic changes. For example, the optical characteristic (astigmatism) at the start of the exposure process is adjusted to a positive or negative value. This is synonymous with adjusting the optical characteristic to a value shifted from the optimum optical characteristic. Alternatively, instead of adjusting the optical characteristic, a configuration may be employed where a condition under which the optical characteristic is optimal (e.g., the position of the substrate stage 111 at which the optical characteristic is optimal) is adjusted to a condition under which the optical characteristic is not optimal.

In addition, desirably, the astigmatism is adjusted so that the value of the astigmatism for the target substrate (for example, one lot) during exposure is close to zero (0) on average while the astigmatism does not exceed the allowable range during processing of the target substrate. After the adjustment process in steps S250 and S260, in step S270, the reticle 104 that has been retracted is moved to a position where the exposure processing can be performed, and the exposure processing is performed with the diffraction optical element 103 switched to the effective light source distribution for the exposure processing (exposure process). Then, the processing ends.

In the present exemplary embodiment, whether to perform the dummy irradiation is determined by determining whether the astigmatism exceeds the allowable range during the processing of the target substrate. However, a threshold may be set instead of the allowable range (predetermined range), and whether to perform the dummy irradiation may be determined by comparing a result of the astigmatism measurement with the threshold.

Figure 8:
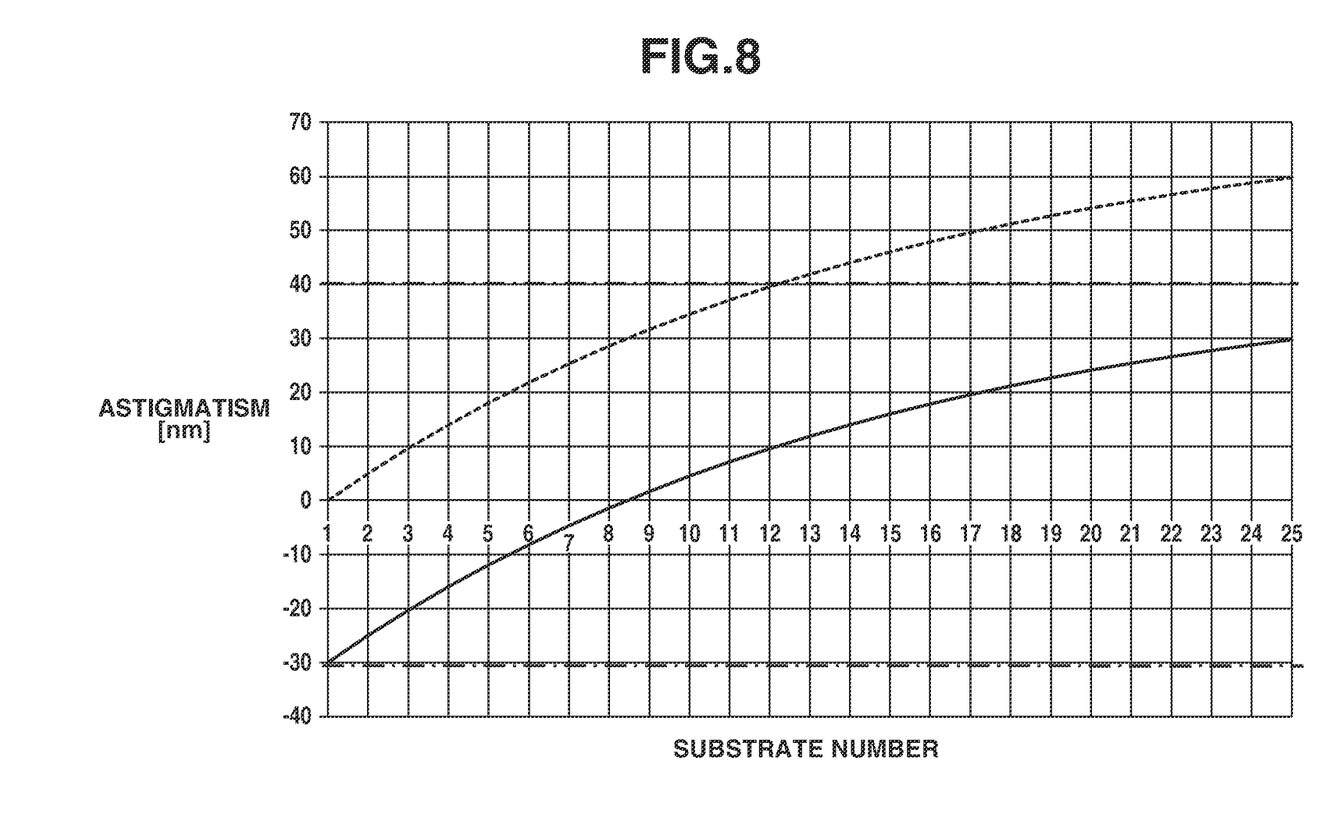
FIG. 8 illustrates an example of astigmatism adjustment according to the first exemplary embodiment.

FIG. 8 illustrates an example of an astigmatism adjustment according to the present exemplary embodiment. In the example of FIG. 8, 25 substrates included in a lot are target substrates. As upper and lower limit values are indicated by dot-dashed lines, the allowable range of the astigmatism in nanometers (nm) is −30 (nm) to +40 (nm). The change in astigmatism in a case where the astigmatism adjustment is not performed is indicated by a dotted line. In the case where the astigmatism adjustment is not performed, the astigmatism exceeds the allowable range when the thirteenth substrate is processed. In such a case, exposure processing results of the thirteenth and subsequent substrates are greatly affected by the astigmatism. In the present exemplary embodiment, based on the measurement result of the astigmatism, the aberration saturation P obtained in advance, and Eqs. (1), (2), and (3), the change in the astigmatism (optical characteristic) during the processing of the target substrate is obtained, and the amount of astigmatism to be adjusted is obtained. Specifically, a temporal change direction (slope direction) of astigmatism and an amount of change in astigmatism (maximum change amount) during processing of target substrates (for example, one lot) are obtained, and then the amount of astigmatism to be adjusted is obtained. Here, the change in astigmatism (optical characteristic) according to the present exemplary embodiment is synonymous with an amount of change (slope) per unit time of astigmatism including elements of the maximum change amount of astigmatism expected to change during processing of target substrates (substrates included in one lot) and a slope direction of astigmatism. In the present exemplary embodiment, the example has been described where the astigmatism is adjusted based on the temporal change direction (slope direction) of astigmatism and the amount of change in astigmatism (maximum change amount) during processing of target substrates (for example, one lot). However, the astigmatism may be adjusted based only on the maximum change amount of the astigmatism. More specifically, the element indicating the change in astigmatism (optical characteristic) according to the present exemplary embodiment includes either or both the amount of change per unit time of the optical characteristic or/and the maximum change amount of the optical characteristic during the exposure processing.

For example, in FIG. 8, from the measurement result of the astigmatism, the aberration saturation P obtained in advance, and Eqs. (1), (2), and (3), it can be predicted that the slope direction of the change in astigmatism is the + direction, and the aberration change amount (maximum change amount) during processing of the target substrates (for example, one lot) is +60 (nm). Thus, the control unit 120 adjusts the astigmatism by dummy irradiation so that the astigmatism does not exceed the allowable range even if the astigmatism changes by +60 (nm). In the example of FIG. 8, the astigmatism is adjusted in the direction (− direction) different from the slope direction (+ direction) of astigmatism, and the adjustment amount is adjusted so that the astigmatism at the start of exposure is −30 (nm), so that the astigmatism is within the allowable range even if the astigmatism adjustment is not performed in the exposure process. In other words, in the adjustment process, the optical characteristic (astigmatism) at the time of starting the exposure process is adjusted toward the sign different from a sign of the slope of the change in the optical characteristic predicted in the prediction process. With this adjustment, the astigmatism during the processing of the target substrate falls within the allowable range, and the effect of aberration on a result of exposure processing can be reduced. In the present exemplary embodiment, the example has been described where the astigmatism is adjusted to −30 (nm) in accordance with the lower limit of the allowable range. However, the astigmatism may be adjusted to −20 (nm) in the example of FIG. 8 since the astigmatism may be adjusted so that the astigmatism falls within the allowable range in the exposure process.

It is desirable that the astigmatism during the exposure processing (exposure process) change at values close to 0 within the allowable range. Thus, desirably, the adjustment of the astigmatism is performed so that the average value of the values of the astigmatism during the exposure processing is close to 0. For example, in the present exemplary embodiment, the astigmatism is adjusted to −25 (nm) so that the average value of the astigmatism in the exposure processing is a value close to 0. In the present exemplary embodiment, the example is described of adjusting the astigmatism. However, the optical characteristic to be adjusted may be any optical characteristic that changes due to irradiation of the projection optical system with light, and is not limited to the astigmatism. Examples of the optical characteristic to be adjusted according to the present exemplary embodiment include spherical aberration, coma aberration, field curvature, and distortion aberration (distortion).

In the present exemplary embodiment, by applying the aberration saturation P acquired in advance and the measurement result of astigmatism to the prediction equations, the aberration generation amount generated during the exposure processing can be predicted, and the astigmatism can be adjusted by performing dummy irradiation based on the prediction result. As a result, the exposure processing can be performed in the state of astigmatism within the allowable range set by the user without adjusting the astigmatism during the exposure processing of the target substrates (for example, one lot), and the effect of the astigmatism on exposure processing results can be reduced.

A second exemplary embodiment is characterized in manufacturing an article using the exposure apparatus (exposure method) according to the first exemplary embodiment.

Figure 9:
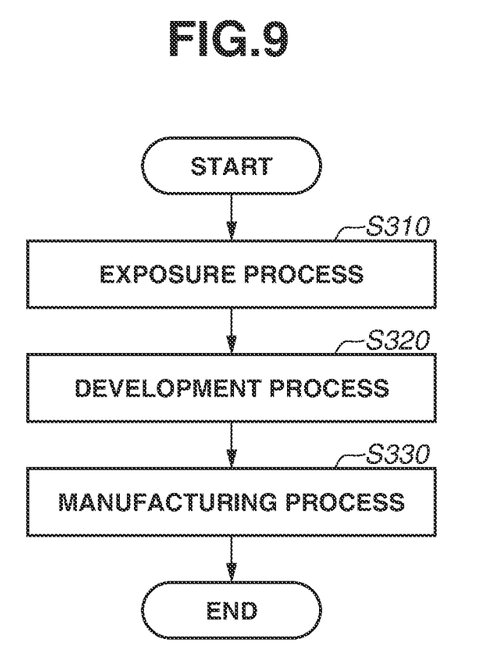
FIG. 9 is a flowchart of a method for manufacturing an article according to a second exemplary embodiment.

FIG. 9 is a flowchart of a method for manufacturing an article according to the present exemplary embodiment. In step S310, an exposure process of adjusting an optical characteristic (astigmatism) and performing exposure of a substrate using the exposure apparatus (exposure method) according to the first exemplary embodiment is performed. In step S320, a development process of developing a photosensitive material patterned by the exposure in the exposure process on the substrate is performed. In step S330, a manufacturing process of manufacturing an article with the substrate developed in the development process is performed.

Examples of the article to be manufactured by the manufacturing method include a semiconductor integrated circuit (IC) element, a liquid crystal display element, a color filter, and microelectromechanical systems (MEMS).

In the exposure process, for example, a substrate (such as a silicon substrate and a glass substrate) on which a photosensitive material is applied is patterned by exposing the substrate using the exposure apparatus (lithography apparatus).

The manufacturing process includes, for example, etching of the substrate developed in the development process, resist removing, dicing, bonding, and packaging. According to the manufacturing method, an article of higher quality than heretofore can be manufactured.

The disclosure of this specification includes various exemplary embodiments and the following exposure method, exposure apparatus, and method for manufacturing an article:

Item 1

According to some embodiments, an exposure method can include:
predicting a change in an optical characteristic of a projection optical system in exposing in which exposure processing is performed on a substrate via the projection optical system;
adjusting the optical characteristic by irradiating the projection optical system with light based on a prediction result in the predicting, before the exposing; and
performing the exposing after the adjusting,
wherein in the adjusting, the optical characteristic at a start of the exposing is adjusted to a positive or negative value based on the change in the optical characteristic predicted in the predicting so that the optical characteristic falls within a predetermined range without adjusting the optical characteristic in the exposing.

Item 2

The exposure method according to some embodiments can include Item 1, wherein the change in the optical characteristic is predicted based on first information and second information, the first information being information for predicting the change in the optical characteristic during the exposing, the second information being information obtained by measuring the optical characteristic before the exposing.

Item 3

The exposure method according to some embodiments can include any one of Items 1 and 2, wherein an element indicating the change in the optical characteristic includes one of or both a change amount per unit time of the optical characteristic and a maximum change amount of the optical characteristic during the exposure processing.

Item 4

The exposure method according to some embodiments can include any one of Items 1 to 3, wherein, in the adjusting, the optical characteristic is adjusted so that an average value of the optical characteristic during the exposure processing is small.

Item 5

The exposure method according to some embodiments can include any one of Items 1 to 4, wherein the predetermined range is set for each exposure processing condition.

Item 6

The exposure method according to some embodiments can include any one of Items 1 to 5, wherein, in the adjusting, the optical characteristic at the start of the exposing is adjusted toward a sign different from a sign of a slope of the change in the optical characteristic predicted in the predicting.

Item 7

The exposure method according to some embodiments can include any one of Items 1 to 6, wherein the optical characteristic is astigmatism of the projection optical system.

Item 8

The exposure method according to some embodiments can include any one of Items 2 to 7, wherein the first information being information for predicting the change in the optical characteristic in the exposing includes information on a first coefficient included in a prediction equation used in the predicting.

Item 9

The exposure method according to some embodiments can include Item 8, wherein the first coefficient is a value indicating an aberration saturation amount.

Item 10

The exposure method according to some embodiments can include any one of Items 1 to 9, wherein the optical characteristic is adjusted, in the adjusting, by the irradiating with the light for a time determined based on a second coefficient indicating an amount of change in the optical characteristic per unit time.

Item 11

The exposure method according to some embodiments can include any one of Items 1 to 10, wherein the irradiating with the light in the adjusting illuminates the projection optical system and not the substrate.

Item 12

The exposure method according to some embodiments can include any one of Items 1 to 11, wherein the adjusting is performed when a patterned master is located at a position to not be illuminated with the light.

Item 13

The exposure method according to some embodiments can include any one of Items 1 to 12, wherein the adjusting is not performed when the prediction result of the predicting indicates that the optical characteristic falls within the predetermined range.

Item 14

The exposure method according to some embodiments can include any one of Items 2 to 13, wherein the first information being information for predicting the change in the optical characteristic in the exposing is stored in association with the exposure processing condition, and in a case where the exposure processing is performed under a same condition as the exposure processing condition, the optical characteristic is predicted using the first information.

Item 15

The exposure method according to some embodiments can include any one of Items 1 to 14, wherein a light intensity distribution on a pupil plane of an illumination optical system during the irradiating with the light is switched based on the prediction result.

Item 16

According to some embodiments, an exposure apparatus can include:
  a projection optical system configured to project light; and
  a control unit configured to perform control such that an optical characteristic when exposure processing of a substrate is performed via the projection optical system is adjusted by irradiating the projection optical system with light;
  wherein the control unit predicts a change in the optical characteristic of the projection optical system and performs control to adjust the optical characteristic at a start of the exposure processing to a positive or negative value based on a prediction result so that the optical characteristic falls within a predetermined range without adjusting the optical characteristic in the exposure processing.

Item 17

According to some embodiments, a method for manufacturing an article can include:
  exposing in which an optical characteristic is adjusted and exposure of a substrate is performed using the exposure method according to any one of Items 1 to 15;
  developing a photosensitive material patterned by the exposure in the exposing on the substrate; and
  manufacturing an article from the substrate developed in the developing.

The present disclosure is not limited to the foregoing exemplary embodiments, and various changes and modifications can be made without departing from the spirit and scope of the disclosure. The claims are therefore appended to make the scope of the disclosure public.

According to some embodiments of the present disclosure, exposure processing can be performed with a reduced effect of aberration.

While the present disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of priority from Japanese Patent Application No. 2022-174674, filed Oct. 31, 2022, which is hereby incorporated by reference herein in its entirety.

What is claimed is:

1. An exposure method comprising:
   predicting a change in an optical characteristic of a projection optical system in exposing in which exposure processing is performed on a plurality of substrates via the projection optical system;
   adjusting the optical characteristic based on a prediction result of the predicting before the exposing; and
   performing the exposing after the adjusting,
   wherein, in the adjusting, the optical characteristic at a start of the exposing is adjusted in a direction different from a direction in which the optical characteristic changes, based on a change in the optical characteristic predicted in the predicting, and
   wherein the optical characteristic is adjusted in the adjusting by irradiating the projection optical system with light.

2. The exposure method according to claim 1, wherein the optical characteristic is adjusted, in the adjusting, by the irradiating with the light for a time determined based on a second coefficient indicating an amount of change in the optical characteristic per unit time.

3. The exposure method according to claim 1, wherein the irradiating with the light in the adjusting illuminates the projection optical system and not a substrate.

4. The exposure method according to claim 1, wherein the adjusting is performed when a patterned master is located at a position to not be illuminated with the light.

5. The exposure method according to claim 1, wherein a light intensity distribution on a pupil plane of an illumination optical system during the irradiating with the light is switched based on the prediction result.

6. The exposure method according to claim 1, wherein the change in the optical characteristic is predicted based on first information and second information, the first information being information for predicting the change in the optical characteristic during the exposing, and the second information being information obtained by measuring the optical characteristic before the exposing.

7. The exposure method according to claim 6, wherein the first information is stored in association with an exposure processing condition, and in a case where the exposure processing is performed under a same condition as the exposure processing condition, the optical characteristic is predicted using the first information.

8. The exposure method according to claim 6, wherein the first information includes information about a first coefficient included in a prediction equation used in the predicting.

9. The exposure method according to claim 8, wherein the first coefficient is a value indicating an aberration saturation amount.

10. The exposure method according to claim 1, wherein an element indicating the change in the optical characteristic includes one of or both a change amount per unit time of the optical characteristic and a maximum change amount of the optical characteristic during the exposure processing.

11. The exposure method according to claim 1, wherein, in the adjusting, the optical characteristic is adjusted so that an average value of the optical characteristic during the exposure processing is a value close to zero (0).

12. The exposure method according to claim 1, wherein, in the adjusting, the optical characteristic at the start of the exposing is adjusted toward a sign different from a sign of a slope of the change in the optical characteristic predicted in the predicting.

13. The exposure method according to claim 1, wherein the optical characteristic is astigmatism of the projection optical system.

14. The exposure method according to claim 1, wherein the adjustment of the optical characteristic in the adjusting adjusts a value of the optical characteristic to be positive or negative.

15. An exposure method comprising:
    predicting a change in an optical characteristic of a projection optical system in exposing in which exposure processing is performed on a plurality of substrates via the projection optical system;
    adjusting the optical characteristic based on a prediction result of the predicting before the exposing; and
    performing the exposing after the adjusting,
    wherein, in the adjusting, the optical characteristic at a start of the exposing is adjusted based on a change in the optical characteristic predicted in the predicting so that the optical characteristic falls within a predetermined range even in a case where the optical characteristic is not adjusted in the exposing, and
    wherein the optical characteristic is adjusted in the adjusting by irradiating the projection optical system with light.

16. The exposure method according to claim 15, wherein the predetermined range is set for each exposure processing condition.

17. The exposure method according to claim 15, wherein the adjusting is not performed in a case where the prediction result of the predicting indicates that the optical characteristic falls within the predetermined range.

18. An exposure apparatus comprising:
    a projection optical system configured to project light; and
    a control unit configured to perform control to adjust an optical characteristic of the projection optical system before exposure processing of a plurality of substrates is performed via the projection optical system,
    wherein the control unit predicts a change in the optical characteristic and performs control to adjust the optical characteristic at a start of the exposure processing in a direction different from a direction in which the optical characteristic changes based on a prediction result, and
    wherein the optical characteristic is adjusted in the adjusting by irradiating the projection optical system with light.

19. A method for manufacturing an article, the method comprising:
    exposing in which an optical characteristic is adjusted and exposure of a substrate is performed using the exposure method according to claim 1;
    developing a photosensitive material patterned by the exposure in the exposing on the substrate; and manufacturing an article from the substrate developed in the developing.

* * * * *